US009482700B2

(12) United States Patent
Meng

(10) Patent No.: US 9,482,700 B2
(45) Date of Patent: Nov. 1, 2016

(54) CURRENT DETECTOR TO SENSE CURRENT WITHOUT BEING IN SERIES WITH CONDUCTOR

(71) Applicant: LENOVO ENTERPRISE SOLUTIONS (SINGAPORE) PTE. LTD., New Tech Park (SG)

(72) Inventor: Jian Meng, Kanata (CA)

(73) Assignee: Lenovo Enterprise Solutions (Singapore) PTE. LTD., New Tech Park (SG)

( * ) Notice: Subject to any disclaimer, the term of this patent is extended or adjusted under 35 U.S.C. 154(b) by 576 days.

(21) Appl. No.: 13/745,832

(22) Filed: Jan. 20, 2013

(65) Prior Publication Data

US 2014/0203803 A1 Jul. 24, 2014

(51) Int. Cl.
*G01R 33/06* (2006.01)
*G01R 15/20* (2006.01)
*B24B 49/00* (2012.01)
*H01F 1/00* (2006.01)

(52) U.S. Cl.
CPC ............ *G01R 15/202* (2013.01); *B24B 49/00* (2013.01); *H01F 1/00* (2013.01); *H01L 2924/00* (2013.01)

(58) Field of Classification Search
CPC ... B24B 49/00; H01L 21/00; H01L 2221/00; H01L 2223/00; H01L 2924/00; G01R 1/00; H01F 1/00; H02J 1/00
See application file for complete search history.

(56) References Cited

U.S. PATENT DOCUMENTS

| 3,582,774 A | 6/1971 | Forgacs |
| 4,378,525 A | 3/1983 | Burdick |
| 5,023,684 A * | 6/1991 | Tsunoda ............... G01R 15/202 257/108 |
| 5,473,244 A | 12/1995 | Libove et al. |
| 8,058,876 B2 | 11/2011 | Cernasov et al. |
| 8,723,515 B2 * | 5/2014 | Motz ................... G01R 33/0029 324/117 H |
| 2001/0052780 A1 * | 12/2001 | Hayat-Dawoodi .. G01R 1/0433 324/117 H |
| 2006/0219436 A1 * | 10/2006 | Taylor .................. G01R 15/202 174/529 |
| 2007/0096278 A1 * | 5/2007 | Nakatsu .............. H01L 23/3675 257/678 |
| 2007/0165376 A1 * | 7/2007 | Bones .................. H01L 25/162 361/688 |
| 2007/0170533 A1 * | 7/2007 | Doogue et al. ............... 257/422 |
| 2007/0279053 A1 | 12/2007 | Taylor et al. |
| 2008/0013298 A1 * | 1/2008 | Sharma ................ G01D 11/245 361/813 |
| 2009/0295368 A1 * | 12/2009 | Doogue ............... G01R 15/207 324/117 H |
| 2012/0074929 A1 | 3/2012 | Wobschall |
| 2014/0203803 A1 * | 7/2014 | Ming ............................ 324/251 |

* cited by examiner

*Primary Examiner* — Jermele M Hollington
*Assistant Examiner* — Temilade Rhodes-Vivour
(74) *Attorney, Agent, or Firm* — Katherine Brown

(57) ABSTRACT

A current detector senses current flowing through a conductor, such as a conductive trace of a circuit board, without being placed in series with the conductor. A first magnetically conductive partial ring is located above the conductor, and a second magnetically conductive partial ring is located below the conductor. Ends of one of the partial rings may be inserted through holes of the circuit board to either side of the conductive trace. The partial rings, upon being contactively aligned with one another, form a magnetically conductive complete ring around the conductor. A Hall effect sensor disposed within one of the partial rings outputs a signal corresponding to the current flowing through the conductor.

15 Claims, 3 Drawing Sheets

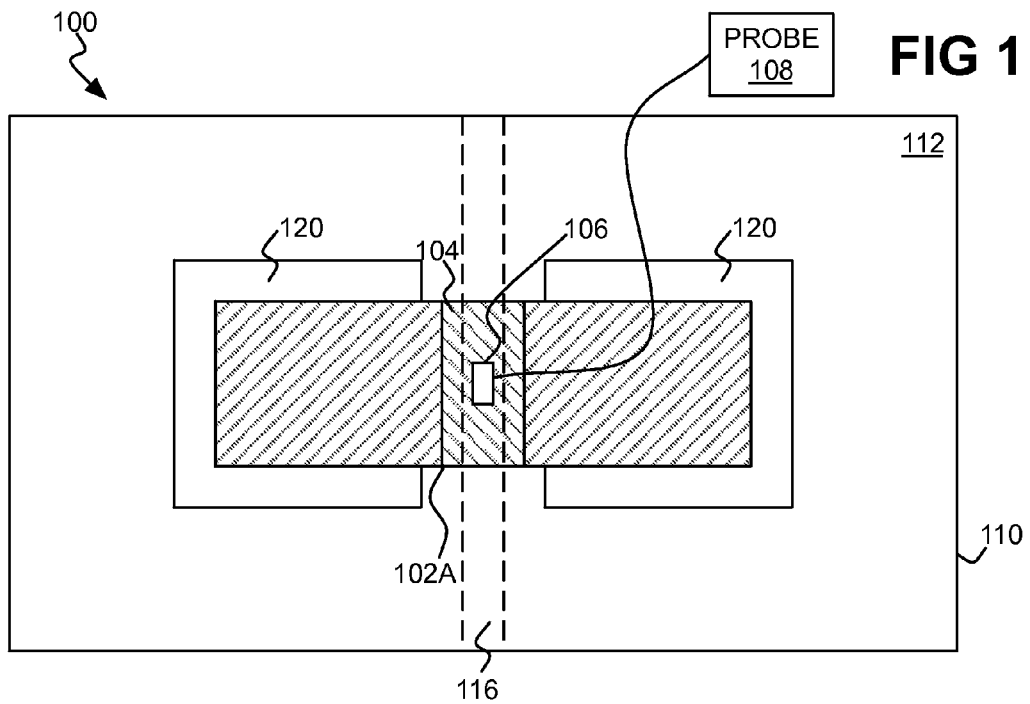
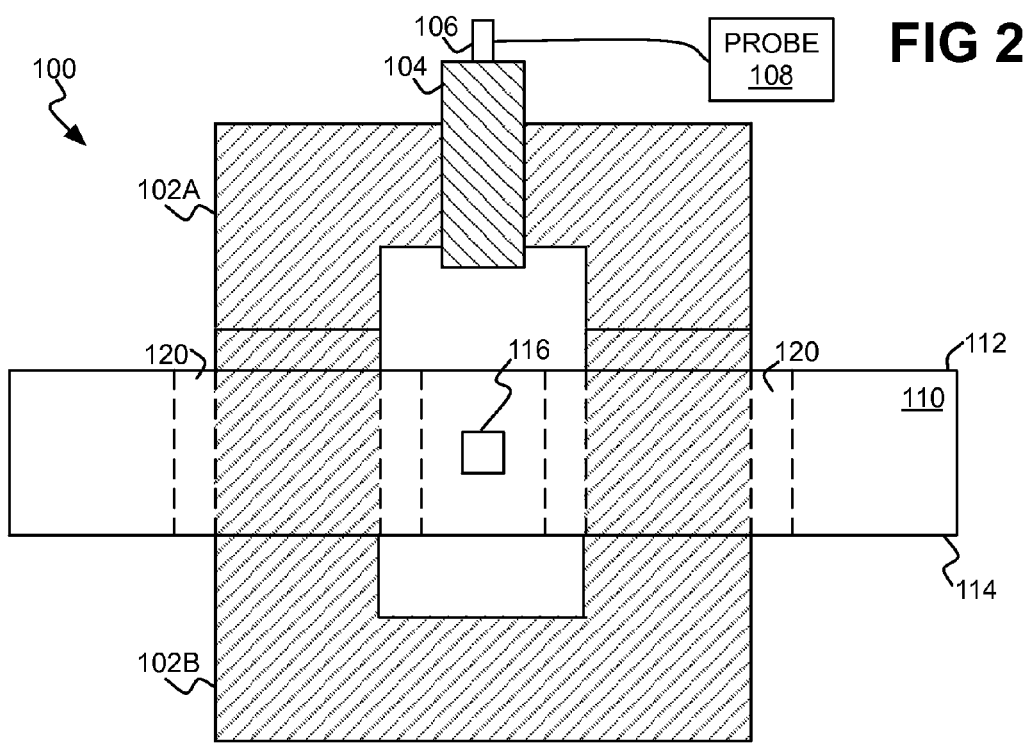

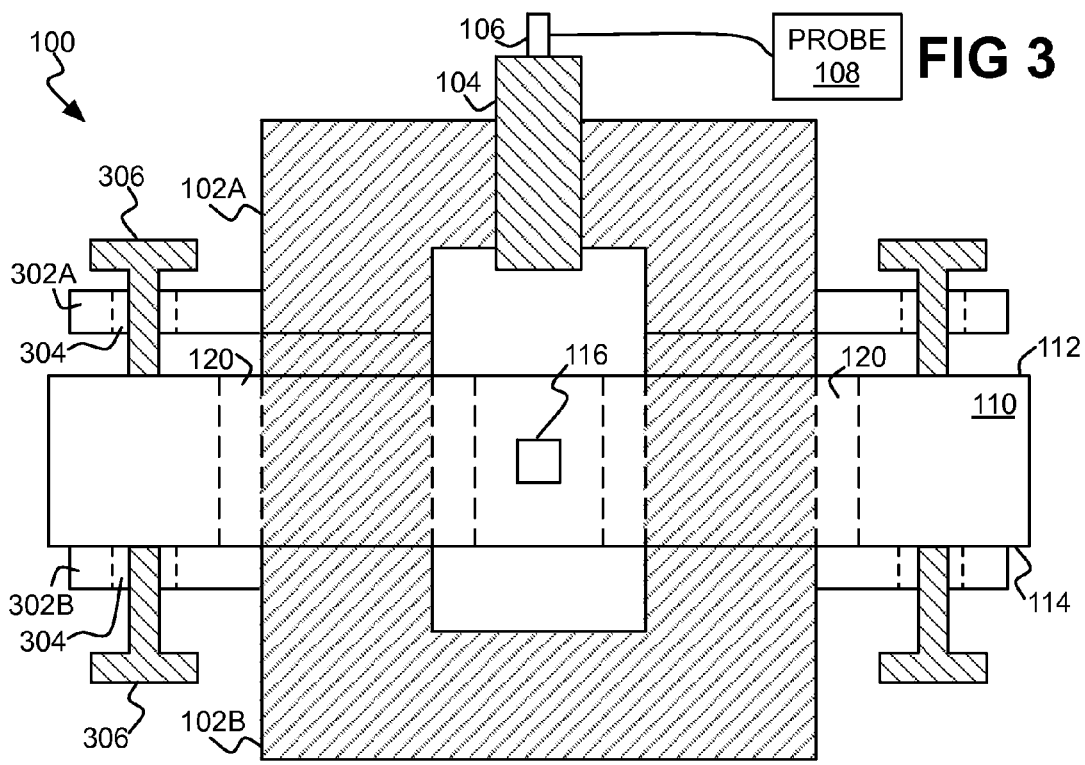
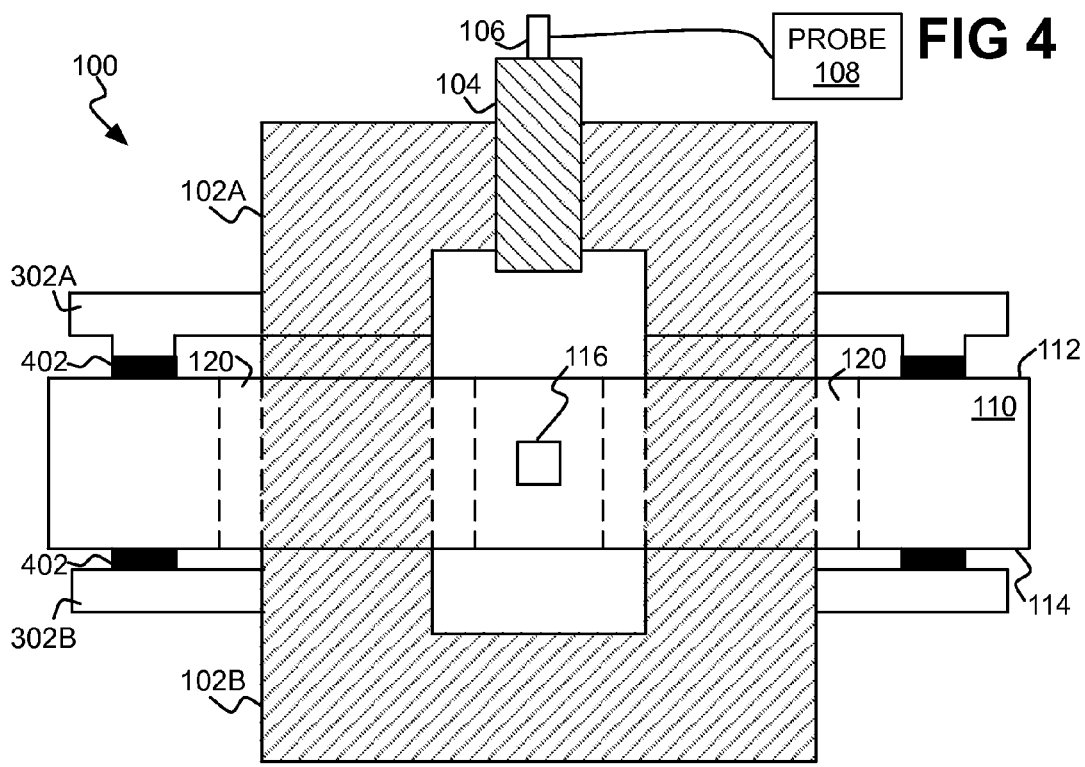

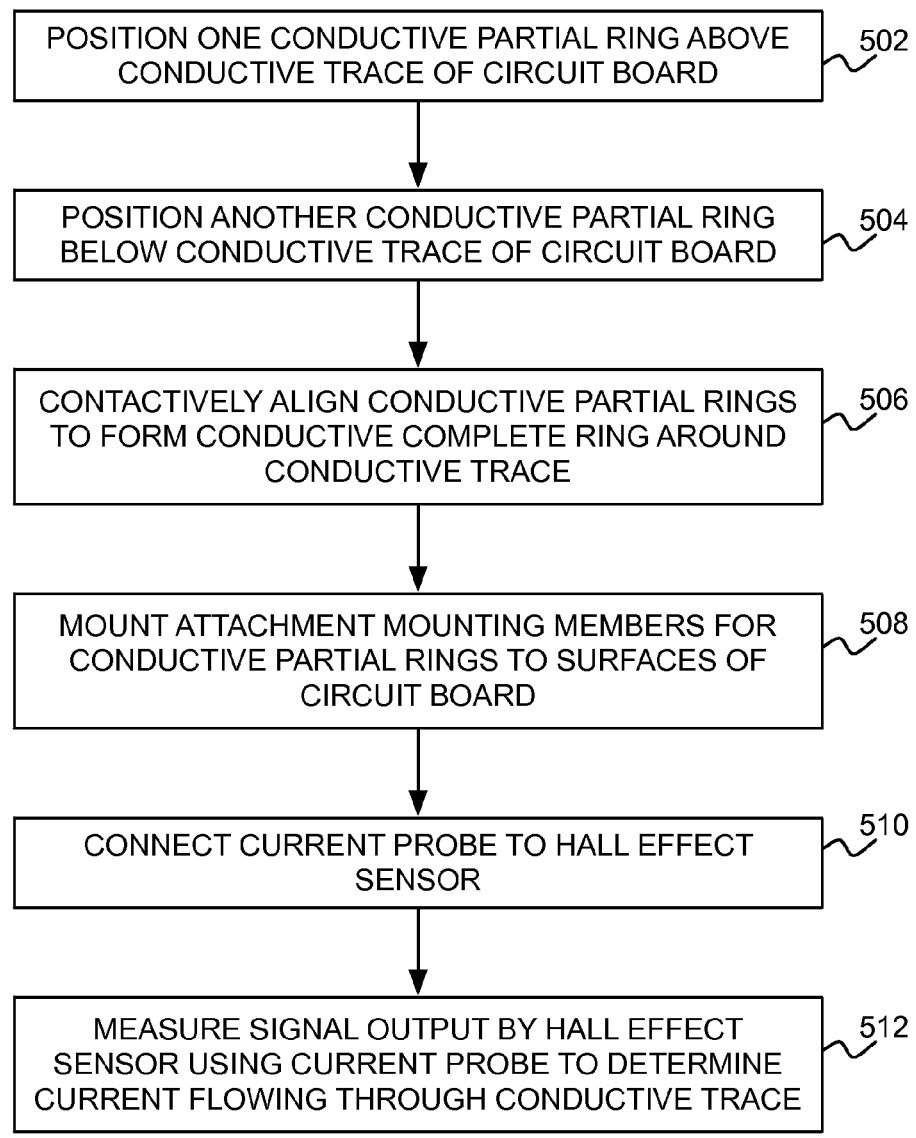

CURRENT DETECTOR TO SENSE CURRENT WITHOUT BEING IN SERIES WITH CONDUCTOR

BACKGROUND

Circuit boards, like printed circuit boards, include conductive traces. Some of these conductive traces can have relatively high amperage current, such as ten amps or more, flowing through them. During testing and at other times, the current flowing through a conductive trace on a circuit board may be measured.

SUMMARY

An example current detector of the disclosure is to sense current flowing through a conductor without being placed in series with the conductor. The current detector includes a first magnetically conductive partial ring to be located above the conductor. The current detector includes a second magnetically conductive partial ring to be located below the conductor and to form a magnetically conductive complete ring together with the first magnetically conductive partial ring around the conductor upon being contactively aligned with the first magnetically conductive partial ring. The current detector includes a Hall effect sensor disposed within one of the first magnetically conductive partial ring and the second magnetically conductive partial ring and to output a signal corresponding to the current flowing through the conductor upon the first magnetically conductive partial ring and the second magnetically conductive partial ring forming the magnetically conductive complete ring.

An example circuit board of the disclosure includes a substrate and a substrate and a conductive trace disposed on or within the substrate. The circuit board includes a pair of through holes within the substrate to either side of the conductive trace through which a pair of ends of one of a first magnetically conductive partial ring and a second magnetically conductive partial ring of a current detector are insertable to form a magnetically conductive complete ring together with another of the first magnetically conductive partial ring and the second magnetically conductive partial ring. A Hall effect sensor of the current detector disposed within one of the first magnetically conductive partial ring and the second magnetically conductive partial ring is to output a signal corresponding to current flowing through the conductive trace.

An example method of the disclosure is for sensing current flowing through a conductive trace of a circuit board without in-series insertion of a current detector with the conductive trace. The method includes positioning a first magnetically conductive partial ring above the conductive trace of the circuit board, and positioning a second magnetically conductive partial ring below the conductive trace of the circuit board. The method includes contactively aligning the first magnetically conductive partial ring with the second magnetically conductive partial ring to form a magnetically conductive complete ring around the conductive trace. The method includes measuring a signal output by a Hall effect sensor disposed within one of the first magnetically conductive partial ring and the second magnetically conductive partial ring. The signal corresponding to the current flowing through the conductive trace.

BRIEF DESCRIPTION OF THE SEVERAL VIEWS OF THE DRAWINGS

The drawings referenced herein form a part of the specification. Features shown in the drawing illustrate only some embodiments of the disclosure, and not of all embodiments of the disclosure, unless the detailed description explicitly indicates otherwise, and readers of the specification should not make implications to the contrary.

FIGS. 1 and 2 are diagrams of a top view and a front view, respectively, of an example current detector to sense current flowing through a conductive trace of a circuit board without being placed in series with the conductive trace.

FIGS. 3 and 4 are diagrams of different examples by which the example current detector can be mounted to the circuit board.

FIG. 5 is a flowchart of an example method for using the example current detector to sense current flowing through the conductive trace of the circuit board without being placed in series with the conductive trace.

DETAILED DESCRIPTION

The following detailed description of exemplary embodiments of the disclosure refers to the accompanying drawings that form a part of the description. The drawings illustrate specific exemplary embodiments in which the disclosure may be practiced. The detailed description, including the drawings, describes these embodiments in sufficient detail to enable those skilled in the art to practice the disclosure. Those skilled in the art may further utilize other embodiments of the disclosure, and make logical, mechanical, and other changes without departing from the spirit or scope of the disclosure. Readers of the following detailed description should, therefore, not interpret the description in a limiting sense, and only the appended claims define the scope of the embodiment of the disclosure.

As noted in the background section, conductive traces of circuit boards like printed circuit boards can carry current, sometimes at high amperage. Existing approaches for sensing and measuring this current place some type of current detector in series with the conductive trace. Such types of current detector include multimeters, current sensor resistors, current probes, and current clamps.

These conventional approaches can be problematic, however. Not all types of current detectors can measure current accurately at high amperage, which usually corresponds to low voltage. Furthermore, they require that a conductive trace be cut so that the current detector can be placed in series with the conductive trace. At best, this requires that the conductive trace be repaired afterwards.

At worst, cutting the conductive trace may be impractical or even impossible. Multilayer or stacked printed circuit boards include multiple layers. A conductive trace of interest may be located within a middle layer of the circuit board. Therefore, it is difficult if not impossible to sever such a conductive trace and insert a current detector in series therewith.

Disclosed herein are techniques to sense current flowing through a conductor, like a conductive trace of a printed circuit board, without requiring a current detector to be placed in series with the conductor. The techniques disclosed herein leverage the Hall effect, which is the production of a voltage difference across an electrical conductor, transverse to current in the conductor and a magnetic field perpendicular to the current. A current detector more specifically leverages the Hall effect to sense the current through a conductor without being placed in series with the conductor.

The current detector includes first and second magnetically conductive partial rings located above and below the conductor. Where the conductor is a conductive trace of a circuit board, the ends of one of the partial rings can be inserted through corresponding holes of the circuit board to either side of the conductive trace. The partial rings are contactively aligned with one another to form a complete magnetically conductive ring around the conductor. A Hall effect sensor disposed within one of the partial rings thus outputs a signal corresponding to the current flowing through the conductor. A current probe may be connected to the sensor to measure this signal and indicate, such as display, this current.

FIGS. 1 and 2 show a top view and a front view, respectively, of an example current detector 100. The current detector 100 includes magnetically conductive partial rings 102A and 102B, which are collectively referred to as the magnetically conductive partial rings 102. The current detector 100 also includes a Hall effect sensor 104, and can include a connector 106 and a current probe 108. The phrase "magnetically conductive" is used herein to differentiate this type of conductivity from electrical conductivity.

A circuit board 110, such as a printed circuit board, has a top surface 112 and a bottom surface 114. The circuit board 110 includes a conductive trace 116, which is more generally a conductor, and which is electrically conductive. As depicted in FIG. 2 in particular, the conductive trace 116 can be located within a middle of the circuit board 110 such that it is difficult or impossible to access from the top surface 112 or the bottom surface 114. The current detector 100 senses and can measure current flowing through the conductive trace 116 of the circuit board 110 without being placed in series with the conductive trace 116. The circuit board 110 can also include through holes 120.

As depicted, ends of the magnetically conductive partial ring 102B are inserted through the through holes 120. However, in other implementations, ends of the magnetically conductive partial ring 102A may also or alternatively be inserted through the through holes 120. The magnetically conductive partial rings 102 are contactively aligned with one another in that the ends of the magnetically conductive partial ring 102A are aligned and make contact with the ends of the magnetically conductive partial ring 102B. As such, the magnetically conductive partial rings 102 together form a magnetically conductive complete ring around the magnetically conductive trace 116.

The Hall effect sensor 104 is disposed within the magnetically conductive partial ring 102A as depicted, but in other implementations can instead be disposed within the magnetically conductive partial ring 102B. The Hall effect sensor 104 uses the Hall effect induced within the magnetically conductive complete ring formed by the magnetically conductive partial rings 102 to output a signal corresponding to the current flowing through the conductive trace 116. The current probe 108 can be directly connected to the Hall effect sensor 104 or connected via the connector 106 thereto to measure and indicate (e.g., display a value of) this current.

The magnetically conductive partial rings 102 may be ferrite, have an iron powder core, may be an alloy like nickel iron molybdenum, and so on. The magnetically conductive partial rings 102 may have shapes, sizes, and thicknesses corresponding to the amount of current that is expected to flow through the conductive trace 116. The Hall effect sensor 104 is effective for both alternating current (AC) and direct current (DC) flowing through the conductive trace 116.

To ensure an accurate measurement of the current flowing through the conductive trace 116, the magnetically conductive complete ring formed by the magnetically conductive partial rings 102 has to be maintained. In one implementation, a clamp can be used to clamp the magnetically conductive partial rings 102 together. FIGS. 3 and 4 show other examples of the current detector 100 for maintaining the magnetically conductive complete ring formed by the magnetically conductive partial rings 102.

In FIG. 3, the current detector 100 includes an attachment mounting member 302A for the magnetically conductive partial ring 102A to mount the partial ring 102A above the conductive trace 116 from the top surface 112 of the circuit board 110. The current detector 100 includes an attachment mounting member 302B for the magnetically conductive partial ring 102B to mount the partial ring 102B below the conductive trace 116 from the bottom surface 114 of the circuit board 110. The attachment mounting members 302A and 302B are collectively referred to as the attachment mounting members 302.

The attachment mounting members 302 each include mounting holes 304 in FIG. 3. Attachment mechanisms, like screws, are inserted through the holes 304 and attached (e.g., screwed against or into in the case of screws) to corresponding portions on the surfaces 112 and 114 of the circuit board 110. Therefore, the magnetically conductive partial rings 102 are effectively secured against the circuit board 110 so that the magnetically conductive complete ring formed by the magnetically conductive partial rings 102 can be maintained.

In FIG. 4, the current detector 100 again includes the attachment mounting members 302 for the magnetically conductive partial rings 102. However, the attachment mounting members 302 in FIG. 4 each include solder pads 402, such as surface mount technology (SMT) solder pads. The solder pads 402 are soldered to corresponding portions on the surfaces 112 and 114 of the circuit board 110 to secure the magnetically conductive partial rings 102 against the circuit board 110. This also maintains the magnetically conductive complete ring formed by the magnetically conductive partial rings 102.

FIG. 5 shows an example method 500 for using the current detector 100 to measure the current flowing through the conductive trace 116 of the circuit board 110. The magnetically conductive partial ring 102A is positioned above the conductive trace 116 (502), and the magnetically conductive partial ring 102B is positioned below the conductive trace 116 (504). Part 502 can be performed by inserting the ends of the magnetically conductive partial ring 102A through the through holes 120 of the circuit board 110, or as depicted in FIG. 1, part 504 can be performed by inserting the ends of the magnetically conductive partial ring 102B through the holes 120.

The magnetically conductive partial rings 102 are contactively aligned with one another to form a magnetically conductive complete ring around the conductive trace 116 of the circuit board 110 (506). The attachment mounting members 302 for the magnetically conductive partial rings 102 can be mounted to the surfaces 112 and 114 of the circuit board 110 (508) to secure the partial rings 102 in position to maintain the magnetically conductive complete ring around the conductive trace 116. The current probe 108 is connected to the Hall effect sensor 104 (510), such as via the connector 106, and the signal output by the sensor 104 is measured using the current probe 108 to determine the current flowing through the conductive trace 116 of the circuit board 110 (512).

The current detector 100 that has been described herein can be employed to sense and measure the current of conductors other than conductive traces of circuit boards. Examples of such conductors include wires, cables, and so on. As such, it is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

I claim:

1. A current detector to sense current flowing through a conductor on a circuit board without being placed in series with the conductor, comprising:
   a first magnetically conductive partial ring to be located above the conductor;
   a second magnetically conductive partial ring to be located below the conductor and to form a magnetically conductive complete ring together with the first magnetically conductive partial ring around the conductor upon being contactively aligned with the first magnetically conductive partial ring;
   a Hall effect sensor disposed within one of the first magnetically conductive partial ring and the second magnetically conductive partial ring and to output a signal corresponding to the current flowing through the conductor upon the first magnetically conductive partial ring and the second magnetically conductive partial ring forming the magnetically conductive complete ring;
   a first attachment mounting member for the first magnetically conductive partial ring to mount the first magnetically conductive partial ring above the conductor from a top surface of the circuit board; and
   a second attachment mounting member for the second magnetically conductive partial ring to mount the second magnetically conductive partial ring below the conduct trace from a bottom surface of the circuit board,
   wherein each of the first attachment mounting member and the second attachment mounting member comprises a solder pad to be soldered to the circuit board.

2. The current detector of claim 1, further comprising a connector to connect the Hall effect sensor to a current probe that is to measure the signal output by the Hall effect sensor and that is to indicate the current flowing through the conductor.

3. The current detector of claim 1, further comprising a current probe connected to the Hall effect sensor to measure the signal output by the Hall effect sensor and to indicate the current flowing through the conductor.

4. The current detector of claim 1, wherein the conductor comprises a conductive trace of a circuit board,
   and wherein a pair of ends of one of the first magnetically conductive partial ring and the second magnetically conductive partial ring are to fit through corresponding through holes on the circuit board to either side of the conductive trace to form the magnetically conductive complete ring together with another of the first magnetically conductive partial ring and the second magnetically conductive partial ring around the conductive trace.

5. The current detector of claim 1, wherein the first partial magnetically conductive ring and the second magnetically conductive ring partial ring are clampable with a clamp to form the magnetically conductive complete ring around the conductor.

6. A circuit board comprising:
   a substrate;
   a conductive trace disposed on or within the substrate;
   a pair of through holes within the substrate to either side of the conductive trace through which a pair of ends of one of a first magnetically conductive partial ring and a second magnetically conductive partial ring of a current detector are insertable to form a magnetically conductive complete ring together with another of the first magnetically conductive partial ring and the second magnetically conductive ring so that a Hall effect sensor of the current detector disposed within one of the first magnetically conductive partial ring and the second magnetically conductive partial ring is to output a signal corresponding to current flowing through the conductive trace;
   a plurality of first portions on a top surface of the substrate to different sides of the conductive trace to which a first attachment mounting member of the current detector and for the first magnetically conductive partial ring is mounted; and
   a plurality of second portions on a bottom surface of the substrate to the different sides of the conductive trace to which a second attachment mounting member of the current detector and for the second magnetically conductive partial ring is mounted.

7. The circuit board of claim 6, wherein the first portions are receptive to first attachment mechanisms being mounted thereto, the first attachment mechanisms insertable into a plurality of holes of the first attachment mounting member,
   and wherein the second portions are receptive to second attachment mechanisms being mounted thereto, the second attachment mechanisms insertable into a plurality of holes of the second attachment mounting member.

8. The circuit board of claim 6, wherein the first portions are receptive to a plurality of solder pads of the first attachment mounting member being soldered thereto,
   and wherein the second portions are receptive to a plurality of solder pads of the second attachment mounting member being soldered thereto.

9. A method for sensing current flowing through a conductive trace of a circuit board without in series insertion of a current detector with the conductive trace, comprising:
   positioning a first magnetically conductive partial ring above the conductive trace of the circuit board;
   positioning a second magnetically conductive partial ring below the conductive trace of the circuit board;
   contactively aligning the first magnetically conductive partial ring with the second magnetically conductive partial ring to form a magnetically conductive complete ring around the conductive trace;
   measuring a signal output by a Hall effect sensor disposed within one of the first magnetically conductive partial ring and the second magnetically conductive partial ring, the signal corresponding to the current flowing through the conductive trace;
   mounting a first attachment mounting member attached to the first magnetically conductive partial ring to a top surface of the circuit board; and
   mounting a second attachment mounting member attached to the second magnetically conductive partial ring to a bottom surface of circuit board.

10. The method of claim 9, wherein positioning the first magnetically conductive partial ring above the conductive trace of the circuit board comprises inserting a pair of ends of the first magnetically conductive partial through corresponding through holes on the circuit board to either side of the conductive trace.

11. The method of claim 9, wherein positioning the second magnetically conductive partial ring below the conductive trace of the circuit board comprises inserting a pair of ends of the below magnetically conductive partial ring through corresponding through holes on the circuit board to either side of the conductive trace.

12. The method of claim 9, wherein measuring the signal output by the Hall effect sensor comprises using a current probe communicatively connected to the Hall effect sensor.

13. The method of claim 9, further comprising:
connecting a current probe to the Hall effect sensor to read the signal output by the Hall effect sensor.

14. The method of claim 9, wherein mounting the first attachment mounting member to the top surface of the circuit board comprises inserting first attachment mechanisms through a plurality of holes of the first attachment mounting member to fix the first attachment mounting member against the top surface of the circuit board, and wherein mounting the second attachment mounting member to the bottom surface of the circuit board comprises inserting second attachment mechanisms through a plurality of holes of the second attachment mounting member to fix the second attachment mounting member against the bottom surface of the circuit board.

15. The method of claim 9, wherein mounting the first attachment mounting member to the top surface of the circuit board comprises soldering a plurality of solder pads of the first attachment mounting member to the top surface of the circuit board, and wherein mounting the second attachment mounting member to the bottom surface of the circuit board comprises soldering a plurality of solder pads of the second attachment mounting member to the bottom surface of the circuit board.

* * * * *